United States Patent [19]

Carter et al.

[11] Patent Number: 4,726,023
[45] Date of Patent: Feb. 16, 1988

[54] DETERMINATION OF TESTABILITY OF COMBINED LOGIC END MEMORY BY IGNORING MEMORY

[75] Inventors: John L. Carter, Berkeley, Calif.; Leendert M. Huisman, Ossining, N.Y.; Thomas W. Williams, Denver, Colo.

[73] Assignee: International Business Machines Corporation, Armonk, N.Y.

[21] Appl. No.: 862,950

[22] Filed: May 14, 1986

[51] Int. Cl.⁴ ............................................. G01R 31/28
[52] U.S. Cl. .................................. 371/15; 324/73 R; 371/21; 371/25
[58] Field of Search ........................... 371/21, 15, 25; 324/73 R, 73 AT

[56] References Cited

U.S. PATENT DOCUMENTS

| | | | |
|---|---|---|---|
| 3,614,608 | 10/1971 | Gledd et al. | 324/73 AT |
| 3,761,695 | 9/1973 | Eichelberger | 371/25 |
| 3,780,277 | 12/1973 | Armstrong et al. | 371/23 |
| 3,783,254 | 12/1974 | Eichelberger | 364/716 |
| 3,784,907 | 1/1974 | Eichelberger | 324/73 AT |
| 3,961,250 | 6/1976 | Snethen | 371/20 |
| 3,961,251 | 6/1976 | Hurley et al. | 324/73 AT |
| 3,961,252 | 6/1976 | Eichelberger | 324/73 AT |
| 3,961,254 | 6/1976 | Eichelberger | 371/21 |
| 4,063,080 | 12/1977 | Eichelberger | 371/62 |
| 4,074,851 | 2/1978 | Eichelberger | 371/25 |
| 4,225,957 | 9/1980 | Doty, Jr. et al. | 371/15 |
| 4,227,244 | 10/1980 | Thorsurd et al. | 364/200 |
| 4,298,980 | 11/1981 | Hajdu et al. | 371/25 |
| 4,326,290 | 4/1982 | Davis et al. | 371/21 |
| 4,481,627 | 11/1984 | Beauchesne et al. | 371/21 |
| 4,503,386 | 3/1985 | DasGupta et al. | 324/73 R |
| 4,608,669 | 8/1986 | Klara et al. | 371/21 X |

*Primary Examiner*—Charles E. Atkinson
*Attorney, Agent, or Firm*—Sughrue, Mion, Zinn, Macpeak, and Seas

[57] ABSTRACT

A method of bounding, from above and below, the probability of uncovering a fault in a logic portion of an integrated circuit having embedded memory. The circuit must be designed according to a specified set of design rules. Then one or more probabilities of fault exposure is calculated for a modified system with the memory portion removed, with its inputs directly connected to its outputs. This probability can be related, by provided relations, to upper and lower bounds of the fault exposure in the unmodified system. The relationships rely upon how the logic portions process given test vectors to control the unremoved memory portion.

6 Claims, 8 Drawing Figures

DETERMINATION OF TESTABILITY OF COMBINED LOGIC END MEMORY BY IGNORING MEMORY

TECHNICAL FIELD

The invention relates generally to testing of systems such as integrated circuits. In particular, the invention relates to determining the testability of the logic parts of integrated circuits containing both logic and memory.

BACKGROUND ART

It is generally acknowledged that complex integrated circuits cannot be manufactured with an absolute assurance that they will work perfectly. Even if design failures are ignored, minor processing variations may cause small portions of the integrated circuit to malfunction and to produce incorrect output for a given set of inputs. Often, the failures are subtle and will produce erroneous outputs only for a small fraction of possible input values. As a result, the practice has developed of electronically testing each integrated circuit that is fabricated. Unfortunately, complex integrated circuits have a large number of input pins, so large that it becomes economically unfeasible to test all possible input patterns. Instead, the practice has developed of subjecting the integrated circuits to a large number, sometimes more than one million, of input test vectors and monitoring the resultant outputs. Any incorrect outputs indicates a faulty chip. Usually, the sequence of test vectors is considered to be random although in fact the sequence is only psuedo-random because the sequence is determined and is the same for testing all chips within a product line. Random pattern testing has numerous potential advantages, including cheaper testing, better testing and the possibility of a self test. However, the sequence of test vectors is not exhaustive and a determination should be made of the probability that a given number of random test vectors will uncover a particular fault. The average value of this probability over all faults is called the fault coverage for such a test and the actual fault coverage needs to be determined separately for every new design.

Testability is a more generic term for fault coverage. A very high numerical value for fault coverage indicates a good testability of a design. There exist several techniques for determining the random pattern testability of given faults, such as a single stuck-at fault, in combinational logic. One possible technique is simulation, that is, a computer simulation of the complete design with a fault selectively inserted at one point. Then, test sequences are generated and based upon extensive runs the fault coverage is determined. Any design, even a design incorporating a memory, can be simulated on a sufficiently powerful simulator. The cost of such a simulator depends on factors such as the power of the simulator and the length of the test sequence necessary to reach an acceptable fault coverage. For many designs, simulation is a practical technique for determining random pattern testability.

For other designs, however, the cost of a complete fault simulation may become prohibitive. Such designs may require analytical techniques such as the input signal probability approach described by Parker et al. in a technical article entitled "Analysis of Logic Circuits with Faults Using Input Signal Probabilities", appearing in IEEE Transactions on Computers, May 1975, pp. 573-578 or the cutting algorithm described by Savir et al. in a technical article entitled "Random Pattern Testability", appearing in Digest, 13th Annual Fault-Tolerant Computing Symposium, June 1983, pp. 80-89. However, these analytic techniques rely on the validity of various Boolean equalities and are, thus, not automatically applicable to designs that contain memories, such as RAMs, embedded in surrounding logic. If the combined memory and logic design is sufficiently simple, for example, if there is not logic on the output side of the RAM, the problem can still be treated analytically, as has been described by McAnney et al. in a technical article "Random Pattern Testing for Data-Line Faults in an Embedded Multiport Memory", appearing in the Proceedings of the International Test Conference, 1985, pp. 100-105. Unfortunately, the simplicity required in the prior art to analytically treat embedded memory is too restrictive for realistic designs.

SUMMARY OF THE INVENTION

Therefore, an object of this invention is to provide a determination of the testability of logic surrounding an embedded memory.

A further object is to determine the testability of the logic surrounding an embedded memory by the maximum use of analytic methods and the minimum use of simulation.

Yet a further object is to determine the testability of the logic surrounding an embedded memory conforming to realistic design rules.

The logic circuitry surrounding the embedded memory is assumed to have been designed according to one of several design rule environments. The design is then modified to remove the memory portions of the design by connecting the inputs of the memory portion directly to the outputs of the memory portion. Then a so called restricted probability of fault exposure is calculated for this modified design. An upper bound and a lower bound for the fault exposure probability of the unmodified design can be derived from the restricted probability. The generation of these bounds relies upon a partial evaluation of the values of the test pattern sequence. The upper bound can be found by ignoring the fact that two reading operations from the same location in memory without an intervening write into that location will either uncover the same fault, or not uncover the fault at all. The lower bound can be established by neglecting all of the reading operations from a given location in a memory that occur after a similar reading operation without an intervening writing operation.

DETAILED DESCRIPTION OF THE PREFERRED EMBODIMENTS OF THE INVENTION

Figure 1:
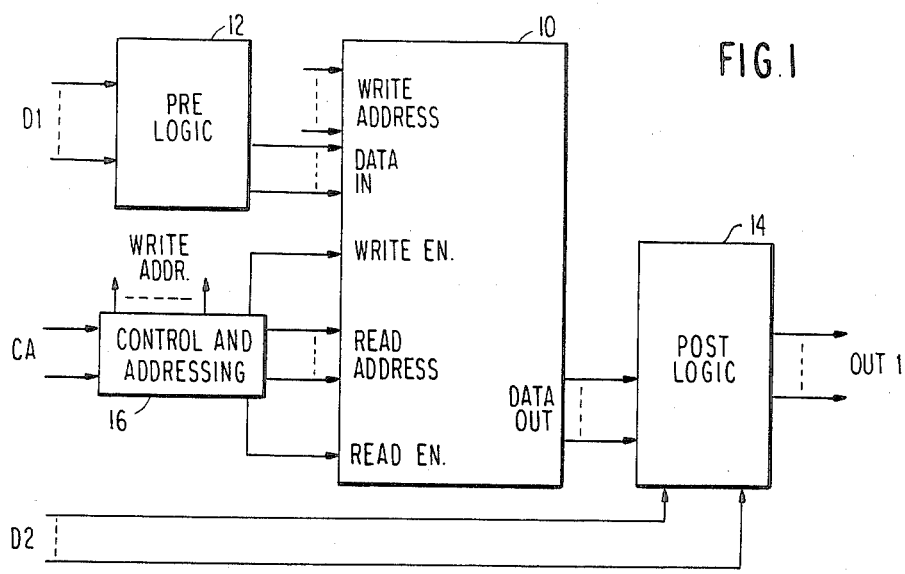
FIG. 1 is a block diagram of an embedded memory system conforming to a first design rule environment.

The practice of the invention requires that the integrated circuit under test conform to one of several design rule environments. That is, the described embodiments do not allow for an unrestrained design of the combination of the logic circuitry and the embedded memory. These design rules are written in terms that require some explanation. In FIG. 1 is shown the allowed structure for a design in the most restrictive design rule environment, called DRE1. Throughout the description, the memory portion or RAM 10 is treated as a single black box and will not be described in detail. The invention does not attempt to uncover faults in the RAM 10. Furthermore, only two-port RAMs, that is, a memory with a separate write port DATA IN and a separate read port DATA OUT will be considered. There are separate addresses READ ADDR and WRITE ADDR for the two ports as well as separate read enable RE and a separate write enable WE. The write port of the RAM 10 receives input signals from primary inputs D1 through combinational logic in a pre-logic section 12. The test vectors are applied to the primary inputs. However, there may be controllable latches actually holding the test vector values but the outputs of the latches will be considered as providing signals to the primary inputs. The read port provides signals to primary outputs OUT1 through combinational logic in a post-logic section 14. In some designs, all primary inputs and outputs are buffered by scanned registers but these registers will be disregarded in the analysis. Operationally, the pre-logic 12 can be delineated by tracing back from the write port DATA IN of the RAM 10 to the primary inputs and then tracing forward from the primary inputs to the primary outputs. Whatever gates are encountered in either the backward trace or the forward trace together constitute the pre-logic 12. The control and addressing of the RAM 10 is performed by a control and addressing section 16 receiving primary inputs CA. The extent of the control and addressing section 16 can be established by a procedure similar to that described above for the pre-logic 12, starting from the address and control inputs to the RAM 10. The read port DATA OUT of the RAM 10 is connected to the primary outputs OUT through post-logic section 14. The post-logic 14 can be delineated by beginning at the write port DATA OUT and tracing to the primary outputs OUT and then tracing backwards to the primary inputs which would include the primary inputs D2 in FIG. 1. Two pieces of the pre-logic 12, the post-logic 14 or the control and addressing 16 are connected if the two pieces share any gate. In testing a circuit, a sequence of test vectors is supplied to the primary input D1, D2 and CA and the result on the primary outputs OUT is observed.

Figure 2:
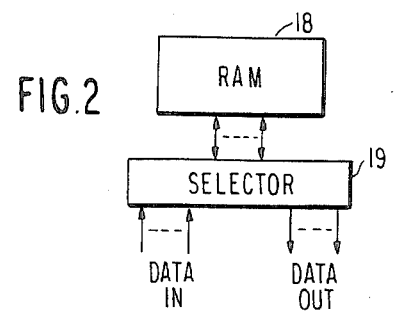
FIG. 2 is a block diagram illustrating the equivalence of a one-part and a two-part memory.

A two-port RAM 10 is not considered to be unduly restrictive. The design rule environment DRE1, shown in FIG. 1, has all of the pre-logic 12, the post-logic 14 and the control and addressing 16 separated from each other. A typical one-port RAM 18 is shown in FIG. 2 and can be forced into the design rule environment DRE1 by incorporating a selector 19 into the two-port RAM 10 of FIG. 1. Then the control and addressing 16 are restrained to always have the write enable WE be complementary to the read enable RA and to set the write address equal to the read address.

The model developed here will assume that the output of the RAM 10 is specified under all possible circumstances. For instance, when the read enable RE is disabled the read port DATA OUT is required to be well defined. Furthermore, the output needs to be well defined when a read and write operation addresses the same location. For simplicity, it will be assumed that when a read and write operation refer to the same address, then the output port DATA OUT contains the data on the input port DATA IN, that is, that the RAM 10 is operating in the flush-through mode. The techniques can be easily modified to model different behavior.

The type of faults that will have their coverage predicted will be restricted in this discussion to single stuck-at faults. Furthermore, these faults will be allowed only in that part of the logic whose forward cone does not include either the control inputs WE and RE or the address inputs to the RAM. Faults in the RAM 10 itself may need a completely different approach such as that presented by Abadir et al. in a technical article entitled "Functional Testing of Semiconductor Random Access Memories", appearing in Computer Surveys, Vol. 15, 1984, pp. 175-198. Faults appearing in the control addressing section 16 will not be considered. However, it is believed that the control and addressing faults are reasonably easy to expose unless they are redundant. Thus, even if simulation were impractical for the logic involved in the data paths, simulation may be an efficient procedure for determining the random pattern testability of the control and addressing section 16.

Figure 3:
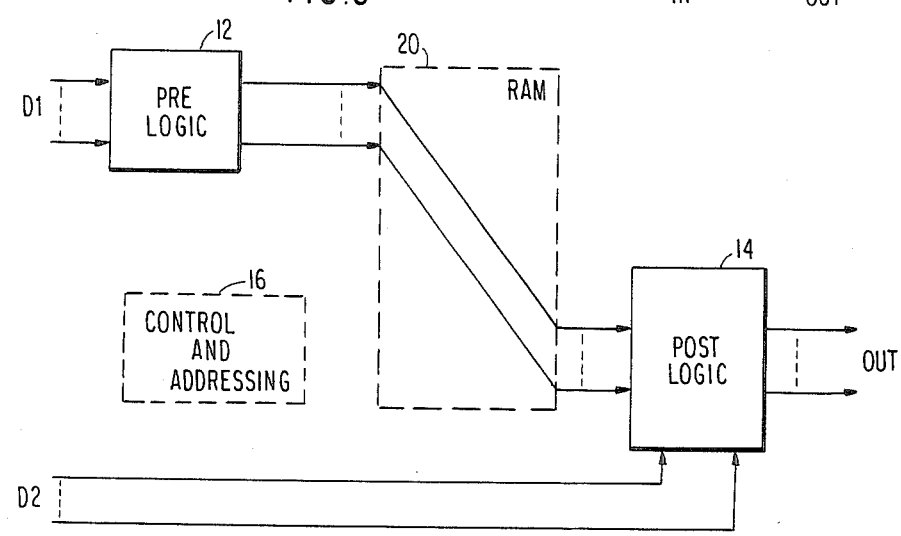
FIG. 3 is a block diagram of the modified logic corresponding to FIG. 1.

The invention relies upon removing the RAM 10 from the combined logic and memory system by connecting the inputs DATA IN of the RAM 10 to the corresponding terminals of the output DATA OUT. That is, as illustrated in FIG. 3 the data merely flows through a pseudo RAM 20. The logic with the RAM 10 having been thus modified will be called the restricted logic. In the design rule environment DRE1, the control and addressing 16 only serves to control the RAM 10 and thus its outputs are no longer being used by the pseudo RAM 20. Furthermore, it is assumed in the model that there are no faults in the control and addressing 16. Accordingly, the control and addressing 16 is not considered in the initial evaluation of the restricted logic of FIG. 3. The restricted logic is purely combinational since the memory portion has been effectively removed. An exposure probability can be easily calculated for the restricted logic since the restricted logic contains only combinational logic. This probability, which will be called a restricted probability $p_r$, can be calculated by the analytical techniques mentioned previously. Alternatively, simulation can be performed on the restricted logic. The more difficult problem is relating the restricted probability $p_r$ to the actual exposure probability of the unmodified design. However, the exposure probability for a fault in the logic will depend upon where in the design the RAM 10 is located. For example, the restricted exposure probability is the same whether the pseudo RAM 20 is located at the inputs to the pre-logic 12, at the outputs of the pre-logic 12 or at the outputs of the post-logic 14, while the actual exposure probability may differ for these three designs. Thus, if one knows only the restricted exposure probability $p_r$, he can obtain only a range of possible values for the actual exposure probability of that fault in the complete design. The range of the actual exposure probability is limited in size, that is, it is not the interval [0,1]. An important feature of the invention is being able to relate the restricted exposure probability to an upper bound and a lower bound of the actual exposure probability.

The invention relies upon the sequence of input test vectors being independent, both between the bits of one input vector and between input vectors. In purely combinational design, this independence between input vectors implies independence between output vectors. In the actual memory design, however, this independence is not necessarily true since a value read from the RAM 10 on one cycle is likely to depend upon the input test vector which cause the value to be written into the RAM 10 at that location. To avoid the non-independence between the test outputs, the concept of a fresh read is introduced. A fresh read is meaningfully defined only for a sequence of test vector inputs. Each of the locations within the RAM is separately tracked. A read occurs when the output of the control and addressing 16, for a particular input test vector, addresses that location on the read address READ ADDR and causes the read enable RE to be enabled. Likewise, a write to that location occurs when the control and addressing 16 addresses that location on the write address and WRITE ADDR causes the write enable WE to be enabled. A fresh read is a read from a particular location that has been written into since the last read from that location. A non-fresh read would thus cause the same contents of that particular location to be read as was read on the last read from that location. On the other hand, since the primary inputs are independent of each other from cycle to cycle, the result of a fresh read is statistically independent of all previous cycles. It is thus seen that the control and addressing logic 16 determines which of the test vectors produce a fresh read.

By restricting the analysis to outputs that are statistically independent, the RAM 10 can be removed and the pre-logic 12 directly connected to the post-logic 14 without affecting the exposure probability of faults in either of the pre-logic 12 or the post logic 14, at least with respect to the set of vectors that produce a fresh read. It is intuitively clear that this can be done because the RAM stores the patterns it receives from the pre-logic 12 and then feeds them to the post-logic 14 in a different order dependent upon the statistically independent read and write addresses. Since the control and addressing 16 is fed from independent random inputs the reordering does not affect the statistical properties of the data inputs to the pre-logic 12. The inventors have, indeed, derived proof that within the design rules environment DRE1, the RAM 20 can be removed without affecting the exposure probabilities. Therefore, for the independent set of test vectors, the restricted exposure probability for the restricted logic of FIG. 3 equals the exposure probability for the unrestricted or original logic.

The restricted exposure probability, so determined provides a lower bound since the number of fresh reads L in a test sequence of length M is a subset of the entire test sequence. Monitoring the output vectors for operations other than fresh reads can only serve to increase the probability of exposure above the restricted exposure probability.

The upper bond to the actual exposure probability is obtained by ignoring the correlation between the sequence of output vectors. The inventors have proved that within the design rule environment DRE1, the exposure probability is increased by ignoring the correlation between different output vectors. Thus, for the upper bound, the restricted probability is assumed to apply to all M members of the test sequence. This approach is equivalent to the test values being written into the RAM 20 immediately becoming visible on the outputs of the RAM 20 when this read enable RE is on. This resembles a constant flush-through operation which thus removes the RAM 20 from consideration.

In fact, two restricted probabilities $p_{r1}$ and $p_{r2}$ need to be determined for any given fault. The first restricted probability $p_{r1}$ is the probability of detecting the given fault by one random test pattern in the restricted logic of FIG. 3 when the read enable RE is active. The second probability $p_{r2}$ is the analogous detection probability when the read port DATA OUT is not enabled by the read enable RE. In DRE1, the second probability $p_{r2}$ is the detection probability when the lines from the pre-logic 12 to the RAM 20 are ignored since they are not connected to the post-logic 14 and are thus not observed and when the lines from the RAM 20 to the post-logic 14 are held at the appropriate output values of the RAM 10 during a non-read cycle (likely default values for the data outputs from the RAM 10 would be all ones or all zeros). In the special situation where there are no primary inputs D2 to the post-logic 14, then faults in the post-logic cause the second probability $p_{r2}=1$ when the given fault happens to be exposed by the default output of the RAM 10 and $p_{r2}=0$ otherwise. In all situations, faults in the pre-logic 12 imply that $p_{r2}$ equals zero. If the read enable RE is always active, which is the case for many designs, then only the first probability $p_{r1}$ is needed. Since the unrestricted logic involved for both $p_{r1}$ and $p_{r2}$ is purely combinational, standard tools can be used to obtain these values as described above.

The first restricted probability $p_{r1}$ is the probability of a random, and therefore statistically independent, test vector exposing a fault with the read enable RE being active. There are the number L of fresh reads in the test sequence. Therefore, a lower bound $p_{lower}$ of the exposure probability with a restricted exposure probability $p_{r1}$ is $$p_{lower}=1-(1-p_{r1})^L \quad (1).$$

Equation (1) follows from standard statistical evaluation of independent events.

It is sometimes necessary to treat L as a random variable, the value of which varies from test sequence to test sequence. This would be the case when the actual test sequence is not known yet. In this case, the value of L is not determined. Instead, the distribution function of L, called f(L), depends on the size of the RAM, on the signal probabilities on the address and control lines to the RAM 10 and on the test length M. Assuming even that these dependencies are known, the lower bound must be calculated as a summation over the distribution.

$$p_{lower}=1-\Sigma_{(L=0, M)}f(L)(1-p_{r1})^L \quad (2).$$

One way to obtain the distribution function f(L) is to calculate first the signal probabilities on the output of the control and addressing section 16 and then to model the RAM by a suitable Markov process. The Markov equations can then be solved either analytically or numerically. The distribution function f(L) can also be obtained by Monte Carlo methods, that is, by simulation. Such a simulation technique is especially useful when the control and addressing logic 16 is complicated or when the Markov equations are too involved to be of any use.

It is important that the expected number of fresh reads not be used in place of the actual number L when one wants to guarantee a true lower bound to the exact exposure probability. If it is impossible to determine the value of L exactly, then one should either use a number that is, with high probability, a lower bound on the number of fresh reads or, alternatively, determine the entire probability distribution f(L).

As mentioned, the upper bound of the exposure probability will be calculated ignoring the correlation between test outputs. Instead of counting the number of fresh reads, for the upper bound the number K of read operations is calculated for the test sequence of length M. This is the number of test vectors producing an active read enable RE. The inventors have proved that an upper bound for the exposure probability of the actual design is $$p_{lower} = 1 - (1-p_{r1})^K (1-p_{r2})^{M-K} \qquad (3).$$

The first non-constant factor is the restricted exposure probability with the read enable RE active raised to the power of the number of such occurrences and the second factor is for ocurrrences with the read enable RE not active.

Let r be the probability that the read select RE is enabled. That is, $r = K/M$. If the read enable RE is always selected, then $r = 1$ and K can only have the value M. In this situation, equation (3) simplifies to $$p_{upper} = 1 - (1-p_{r1})^M \qquad (4).$$

In some situations, the number K of read operations must be treated as a random variable with a probability distribution g(K). Because the control and addressing section 16 is combinational, this is an independent trials process with probability r of success. As a result, the distribution function is given by $$g(K) = comb(M,K) r^K (1-r)^{M-K} \qquad (5).$$

Where comb(M,K) is the combinatorial function. Then summing equation (3) with this distribution function produces an upper bound of $$p_{upper} = 1 - (1 - rp_{r1} - (1-r)p_{r2})^M \qquad (6).$$

The preceding discussion for both the upper and lower bounds concerns a single fault. Each fault needs to be separately addressed with the corresponding generation of the restricted probabilities and the generation of associated upper and lower bounds. The total testability when then have an upper and lower bound that are the sums of the upper bounds $p_{upper}$ and lower bounds $p_{lower}$ for all the faults as divided by the normalizing factor of the number of faults.

Figure 4:
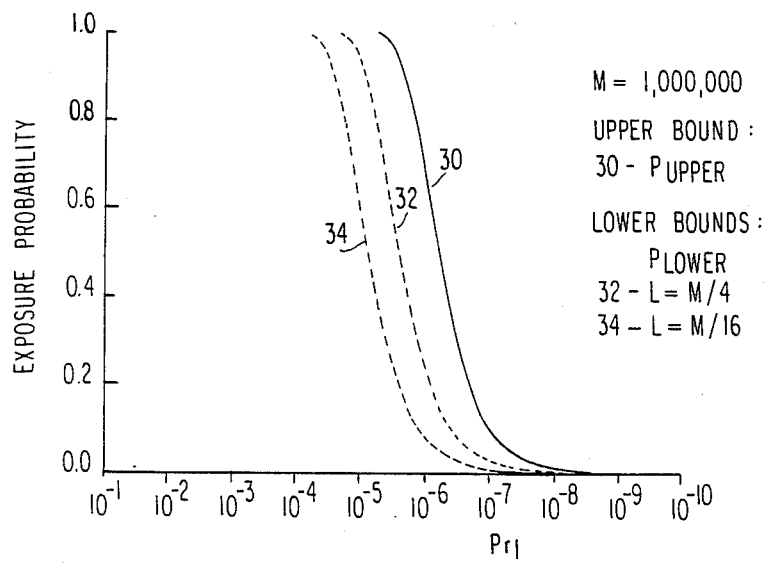
FIG. 4 is a graph for the bounds of exposure probabilities for the embedded memory system of FIG. 1.

A sample calculation is illustrated in FIG. 4. The test length M was $10^6$ and the restricted probability $p_{r1}$ was varied between $10^{-1}$ and $10^{-10}$. The read enable RE was always selected so that $r = 1$ and therefore the second restricted probability $p_{r2}$ was not required. For the upper bound $p_{upper}$, equation (4) was used to calculate the curve 30. For the lower bound $p_{lower}$, two values of the number of fresh reads was used, as would perhaps be determined by Monte Carlo calcuation. A curve 32 corresponds to the case where $L = M/4$ and a curve 34 corresponds to the case where $L = M/16$. FIG. 4 demonstrates that for a given value of the restricted probability $p_{r1}$, the range of possible exposure probabilities is not very large. For example, if $L = M/4$ so that the curve 32 is used for the lower bound, then for an exposure probability $p_{r1}$ of greater than $10^{-5}$ or less than $10^{-7}$, the upper and lower bounds are nearly equal for normal testing purposes. It should be noted that the central part of these curves around $p_{r1} = 10^{-6}$ can be normalized such that, to a good approximation, the central part is a function of $Mp_{r1}$ for different values of M. It is expected that most faults will have restricted exposure probabilities that are either very large or very small compared to 1/M (to $10^{-6}$ in this example). Consequently, the upper and lower bounds of the total test coverage, obtained by summing the upper and lower bounds of the exposure probabilities of all the faults are expected to be close.

In a typical testing program, the number M of test vectors is determined by economic considerations. Then FIG. 4 is used as follows. The restricted probability $p_{r1}$ is calculated. If the lower bound $p_{lower}$ for that $p_{r1}$ is higher than an acceptable exposure probability, say 98%, then the design is considered to be testable. If, however, the upper bound $p_{upper}$ is below this acceptable exposure probability, so that the lower bound is even lower, than the design is obviously not testable. If, however, the acceptable exposure probability falls between the upper and lower bounds, further evaluation is required for a determination of testability.

Figure 5:
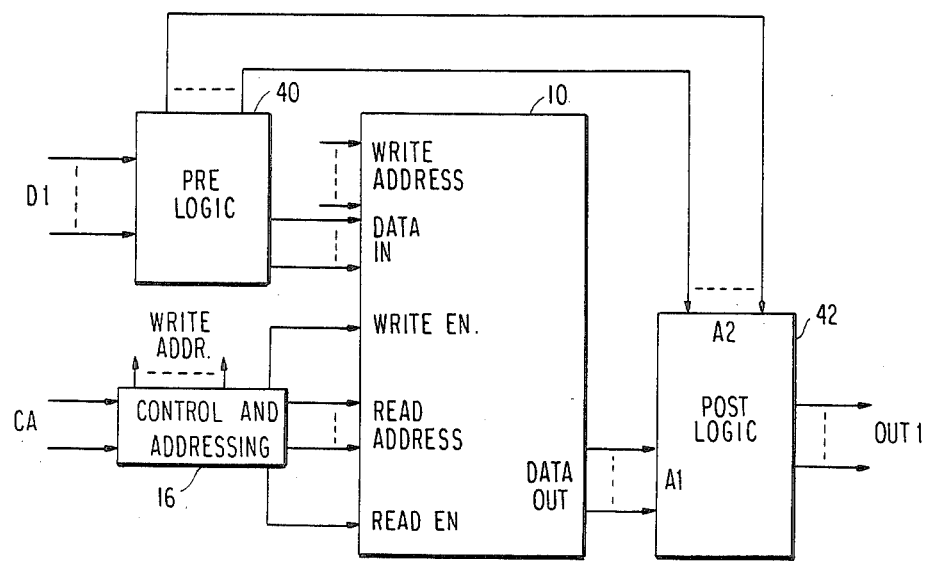
FIG. 5 is a block diagram of an embedded memory system conforming to a second design rule environment.

The second design rule environment DRE2 will now be discussed. As illustrated in FIG. 5, in DRE2, a pre-logic section 40 is connected to a post-logic section 42 but the connections between the pre-logic 40 and the post-logic 42 are such that there is no feedback from the output of the RAM 10 to its input, that is, information flows from the pre-logic 40 to the post-logic 42 but not vice-a-versa. This second design rule environment includes DRE1 as a special case because some of the D1 inputs may directly input the post-logic 42 directly, without being gated by the pre-logic 40. These special inputs were labelled separately by D2 in FIG. 1. There is no connection between either the pre-logic 40 or the post-logic 42 and the control and addressing section 16. The inputs to the post-logic 42 from the RAM 10 are labelled as A1 inputs while those from the pre-logic 40 are labelled as A2 inputs. This design rule environment DRE2 also covers the case when some of the outputs of the pre-logic 40 are directly connected to primary outputs OUT1.

In DRE1 a vector can be read many times from the RAM 10 before being overwritten, which thus causes a correlation between the output vectors of the RAM 10. This type of correlation will be called a correlation of the first kind. The direct connection between the pre-logic and the post-logic to DRE2 introduces statistical correlations which did not exist in DRE1. In DRE2, a single partial test vector at the D1 inputs to the pre-logic 40 at a time t directly influences the output OUT1 from the post-logic 42 at that time t because of the A2 inputs from the pre-logic 40. Also, the same partial test vector affects what is written into some location of the RAM 10 at that time t. Subsequently, at a time t, that location of the RAM 10 can be read through the post-logic 42 to the primary outputs OUT1. As a result, the output vectors at the times t and t are correlated. This will be called a correlation of the second kind.

In DRE2, there will be two different types of restricted logic, both of which will be used. In the restricted logic of type 1, shown in FIG. 6, the outputs of the pre-logic 40 to the RAM 10 are instead directly connected to the A1 inputs of the post-logic 42. That is, the data inputs flow through the pseudo RAM 20. This configuration for the restricted logic implies that the signals entering the A1 inputs of the post-logic 42 arise from the same D1 primary inputs as create the A2 inputs to the post-logic 42, that is, at the same time t. This is the configuration for a read/write flush-through. By flush-through is meant that the control and addressing section 16, for a particular input test vector, produces both an active read enable RE and an active write enable WE and equal read and write addresses so that in the unmodified logic the data indeed flows through the RAM 10. For the restricted logic of type 1 of FIG. 6, a restricted exposure probability $p_{r1}$ is calculated for any given fault by the techniques described for calculating similar probabilities in DRE1. It is to be noted that this restricted exposure probability $p_{r1}$ is only needed when the read enable RE is active.

Figure 7:
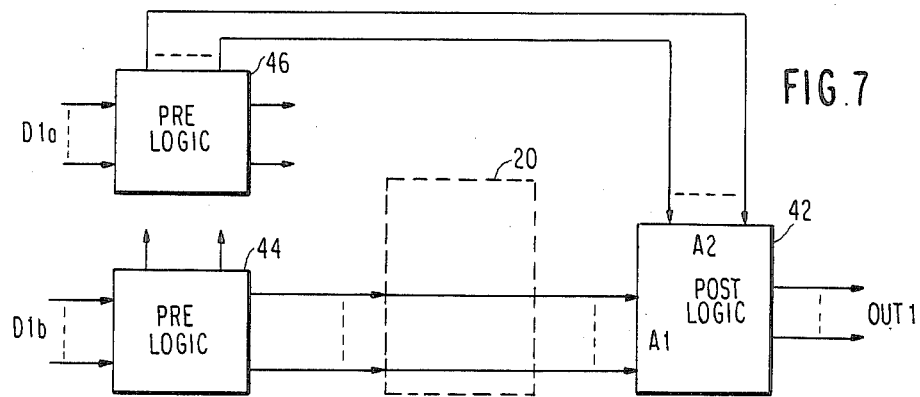

The restricted logic of type 2 for DRE2 is shown in FIG. 7 and applies to situations other than a flush-/through read/write. The pre-logic is replicated into a first pre-logic 44 that has its data inputs to the RAM 10 instead connected to the A1 inputs to the post-logic 42 and a second pre-logic 46 that has the direct connections to the A2 of the post-logic 42. The remaining outputs of the two pre-logic sections 44 and 46 are not monitored. There are separate primary inputs D1b and D1a to the two pre-logic sections 44 and 46. The primary inputs D1a and D1b are independent of each other and the complete set of primary inputs D1a, D1b and D2 can be considered as carrying a random test vector. Two restricted exposure probabilities are calculated for the restricted logic of type 2, $p_{r21}$ when the read enable RE is active and $p_{r22}$ for the case when the read enable RE is inactive. It should be noted that if a fault is inserted into the pre-logic, then this fault must be duplicated in both of the two pre-logic sections 44 and 46. The read probability r can be determined by the same method as described for DRE1.

A lower bound $p_{lower}$ can be obtained by removing sufficiently many output vectors from consideration, as was explained for DRE1. However, because of the correlations of the second kind in DRE2, not all fresh reads should be monitored. The inventors have shown that not more than half of the fresh reads that are not flush-through write/reads should also be removed from consideration to guarantee that the remaining output vectors are uncorrelated. The number K of reads and the number L of fresh reads in a test sequence of length M are determined by the same methods as described for DRE1. Additionally, the number N of flush-through write/reads can be obtained by similar techniques. Then, a lower bound of the actual exposure probability can be calculated from the restricted exposure probabilities as $$p_{lower} = 1 - (1 - p_{r1})^N (1 - p_{r21})^{(L-N)/2} \quad (7)$$

The first non-constant factor is the probability of not detecting the fault in the N flush-through operations and the second factor is the probability of not detecting the fault in the (L-N)/2 uncorrelated, non-flush-through fresh reads.

When L and N are random variables, a more complicated expression results which is similar to equation (2).

For the upper bound in DRE2, the inventors have shown that an upper bound of the exact exposure probability is given by $$p_{upper} = MIN\{((1 - (1 - p_{r22})^{(M-K)}) + (1 - (1 - p_{r1})^N) + \quad (8)$$
$$2(1 - (1 - p_{r21})^{(K-N)/2})), 1\}$$

The MIN function is required since the variable term can exceed unity.

In the case where the test vector sequence has not yet been determined, K must be treated as a random with the distribution g(K). The properties of g(K) have previously been discussed. After averaging over all values of K, the value for the upper bound is given by $$p_{upper} = MIN\{(1 - (r + (1 - r)(1 - p_{r22}))^M + 1 - (1 - p_{r1})^N + \quad (9)$$
$$2[1 - (\sqrt{1 - p_{r21}})^{-N}(1 - r + r\sqrt{1 - p_{r21}})^M]), 1\}$$

In this equation, the minimum of unity and the variable part is taken.

Figure 8:
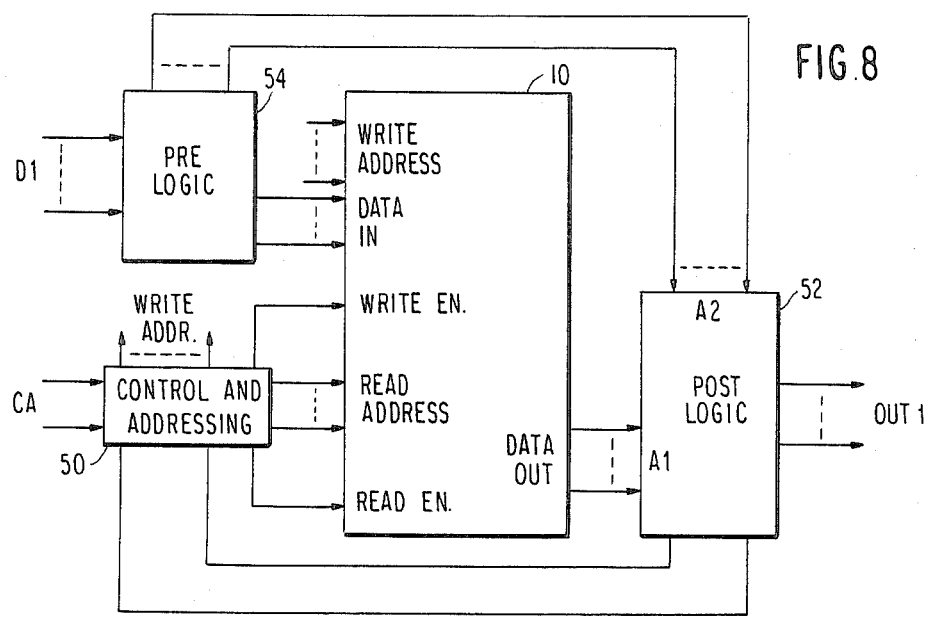
FIG. 8 is a block diagram of an embedded memory system conforming to a third design rule environment.

In the design rule environment DRE3, the pre-logic 12 is connected to the post-logic 14, just as in DRE2. Additionally, the control and addressing section is connected to either one of the pre-logic 12 or post-logic 14 but not to both of them. All connections are such that there is no feedback from the outputs of the RAM 10 to its inputs. Only the example wil be described, in reference to FIG. 8, with the control and addressing section 50 connected to the post-logic 52 but not to the pre-logic 54.

The correlations of the first and second kind which were discussed for the design rule environment DRE2 apply also to DRE3. An additional complication is that the exposure probability of a fault may depend upon the address through which the exposing vector passes through the RAM 10. That is, whether a fault is exposed by passing through the post-logic 52 depends upon the same primary inputs that determine the reading and writing in the RAM 10.

Figure 6:
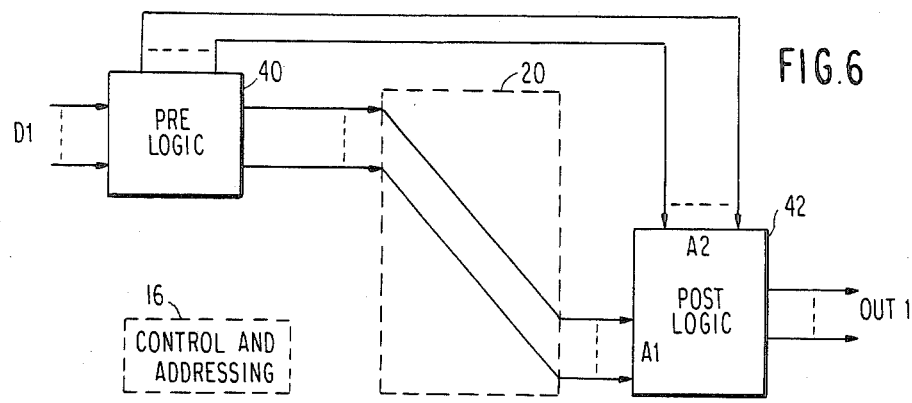
FIGS. 6 and 7 are block diagrams of two modified logics corresponding to FIG. 5.

Just as in DRE2, there are the restricted logic of type 1 and the restricted logic of type 2, similar to FIGS. 6 and 7. If, on the other hand, the pre-logic 54 is not connected to the post-logic 52, then only a single restricted logic, analogous to FIG. 3 is required. If there is a connection between the pre-logic 54 and the post-logic 52, then analytical means are used to determine the restricted probabilities $p_{r22}$, analogous to $p_{r22}$ in DRE2, and conditional restricted probabilities $p_{r1}(i)$ and $p_{r21}(i)$. The probability $p_{r1}(i)$ is the probability of fault exposure in the restricted logic of type 1 when the read enable RE is on and the read address is "i"; $p_{r21}(i)$ is the analogous conditional exposure probability for the restricted logic of type 2. Conditional restricted probabilities is meant that the exposing vector passes the RAM 10 through the address i. In the situation where the pre-logic 54 is not connected to the post-logic 52, then, similarly to DRE1, it is required to analytically determine the restricted probabilities $p_{r2}$ and $p_{r1}(i)$. The test vector sequence, if known, is analyzed to determine the sets $\{n_i\}$ and $\{l_i\}$. The number $n_i$ is the number of flush-through write/reads from the address i and the number $l_i$ is the number of an appropriately chosen subset of fresh reads from the address i. The subset is chosen such that no correlation of the second kind exists between its elements.

In the case where the pre-logic 54 is not connected to the post-logic 52, there is the relation $\Sigma l_i \times L$ and the lower bound of the exposure probability is given by $$p_{lower} = 1 - \text{PROD}_i (1 - p_{r1}(i)^{l_i} \quad (10)$$

The operator $\text{PROD}_i$ represents the product of all terms indexed by i.

In the case where the pre-logic 54 is connected to the post-logic 52, then the corresponding relation is $\Sigma(l_i - n_i) = \frac{1}{2}(L-N)$ and the lower bound of the exposure probability is then given by $$p_{lower} = 1 - \text{PROD}_i (1 - p_{r1}(i))^{n_i} \times (1 - p_{r21}(i))^{l_i - n_i} \quad (11)$$

If in fact the exposure probabilities are independent of the address i, then equations (1) and (7) are obtained.

The determination of the upper bound of the exposure probability can be done for DRE3 just as for DRE1 or DRE2. As a result, equations (8) and (9) can be used in DRE3 when the pre-logic 54 is connected to the post-logic 52 and equations (3) and (4) should be used when the pre-logic 54 and post-logic 52 are disconnected.

The case for which the control and addressing section 50 is connected to the pre-logic 54 rather than to the post-logic 52 can be handled in similar fashion. When duplicating the pre-logic, the control and addressing section has to be duplicated with it. The procedure for determining the upper and lower bounds remains the same.

In conclusion, we would like to summarize the steps involved in determining the random-pattern testability of the logic surrounding an embedded array using the TRIM method. For simplicity, we will assume in this summary that the read port of the array is always enabled. In the text, we have described how the upper bound calculation must be modified when this is not the case.

Step 1: Determine the Design Rule Environment that applies to the design under consideration. Also check that the C-A logic is not connected simultaneously to both pre-logic and post-logic. The Design Rule Environments that are allowed are:

1. DRE1: pre-logic, post-logic and C-A logic are disconnected from each other.
2. DRE2: pre-logic and post-logic are connected, but are disconnected from the C-A logic. The connections between the pre-logic and the post-logic have to be such that there is not feedback from the output of the array to the input.
3. DRE3: pre-logic and post-logic are connected and the C-A logic is connected to either one of them but not to both. The connections have to be such that there is no feedback from the outputs of the array to the inputs.

The restriction on the possible connections of the C-A logic is imposed to insure the independence of various signals which might otherwise invalidate the technique, and to insure the absence of feedback loops.

Step 2: Determine the number of fresh reads L which occur during the test. If necessary, determine also the number of flush-through write/reads N.

The best way to do this is by simulating the actual sequence of test patterns which will be used. The simulation should not take long, since only a small portion of the design (namely the C-A logic) need be simulated, and since we only need a good-circuit simulation of this circuit (since we are only concerned with faults in the pre-logic and post-logic). The reader is cautioned not to use the expected number of fresh reads in place of the actual number L. If it is impossible to determine L exactly, then one should either use a number which is with high probability a lower bound on the number of fresh reads, or determine the entire probability distribution f(L) and use the method described in the text. A similar caution applies to the number of flush-through write/reads. If N cannot be determined exactly, it can always be replaced by zero. This will reduce the lower bound without making it trivial.

Step 3: For each fault in the pre-logic and post-logic, determine the required restricted exposure probabilities. When DRE1 applies, the true exposure probability of the fault in the original logic is at least $1-(1-p)^L$, and at most $1-(1-p)^M$ (where M is the number of test patterns.) Similar but more complicated expressions apply for DRE2 and DRE3.

The restricted logic is combinational, so one can use any of several known techniques for determining the required restricted exposure probabilities. Since the computation time required to determine these exposure probabilities is primarily related to the depth of the circuit, and since the residual logic is usually significantly less deep than ordinary logic, the computation requirements will not be that great. In any case, a statistically significant sample of faults can be used in place of all faults.

Step 4: Compute upper and lower bounds on the expected coverage by taking the average (over all faults) of the upper and lower bounds derived in step 3.

These bounds are likely to be quite close. For example, consider a design that is within DRE1. If an individual fault f has a value for $p_f$ which is either significantly smaller than 1/M or significantly larger than 1/L, then its corresponding upper and lower bounds will be nearly equal. Thus, unless many faults have their p in the critical range, the lower and upper bounds on the expected coverage will be nearly equal. If the bounds are significantly different, then it might be best either to change the test protocol so that the bounds are closer together (by perhaps increasing the write probability), or else to use a longer test sequence.

Having thus described our invention, what we claim as new, and desire to secure by Letters Patent is:

1. A method for bounding fault exposure of faults in the logic part of a combined logic and memory system tested by a set of input test vectors, comprising the steps of:

removing a portion comprising memory from a combined logic and memory system;

connecting one or more data inputs that were connected to said memory portion before it was removed to corresponding data outputs that were connected to said memory portion before it was removed;

determining at least one first probability of exposure of a fault in a logic portion of said system by a set of input test vectors applied to said system modified by said removing and connecting steps;

calculating at least one of an upper and a lower bound of a second probability of exposure of said fault in said system unmodified by said removing and connecting steps, said upper and lower bounds of said second probability being dependent upon said at least one first probability and said set of input test vectors; and deciding if said logic and memory system is testable by comparing said at least one of an upper and lower bound against at least one predetermined probability.

2. A method as recited in claim 1, wherein said logic portion comprises:
   a pre-logic section receiving inputs and providing signals to said data inputs of said unremoved memory portion;
   a post-logic section receiving primary inputs and signals from said data outputs of said unremoved memory portion and providing outputs from said system; and
   a control and addressing section receiving primary inputs and signals from said data outputs of said unremoved memory portion and providing outputs from said system; and
   a control and addressing section receiving primary inputs and providing control and addressing signals to said unremoved memory portion, there being no other connections between said pre-logic section, and post-logic section and said control and addressing section; and
   wherein said set of input test vectors are applied to said primary inputs.

3. A method as recited in claim 2,
   wherein said first probability is a probability of exposing said fault when said memory portion in said system with said memory portion being unremoved is being read; and
   wherein said calculating step includes calculating said lower bound and includes the steps of:
   determining a first number of input test vectors in said set which causes said control and addressing section to control said unremoved memory portion to be read from any location in said memory portion that has been written to since the last reading of said any location; and
   equating said lower bound with an algebraic combination of said first probability and said first number.

4. A method as recited in claim 2,
   wherein said at least one first probability comprises a third probability of exposing said fault when said unremoved memory portion is being read and a fourth probability of exposing said fault when said unremoved memory portion is not being read; and upper bound and includes the steps of:
   determining a second number of input test vectors in said set which causes said control and addressing section to control said unremoved memory portion to be read; and
   equating said upper bound with an algebraic combination of said third and fourth probabilities and said second number.

5. A method as recited in claim 1, wherein said logic portion comprises:
   a pre-logic section receiving primary inputs and providing signals to said data inputs of said unremoved memory portion;
   a post-logic section and from said data outputs of said unremoved memory portion and providing outputs from said system; and
   a control and addressing section receiving primary inputs and providing control and addressing signals to said unremoved memory portion, there being no other connections between said pre-logic section, said post-logic section and said control and addressing section; and
   wherein said set of input test vectors are applied to said primary inputs.

6. A method as recited in claim 1, wherein said logic portion comprises:
   a pre-logic section receiving primary inputs and providing signals to said data inputs of said unremoved memory portion;
   a post-logic section receiving signals from said pre-logic section and from said data outputs of said unremoved memory portion and providing outputs from said system; and
   a control and addressing section receiving primary inputs and providing control and addressing signals to said unremoved memory portion, and providing signals to only one of said pre-logic section and said post-logic section; and
   wherein said set of input test vectors are applied to said primary inputs.

* * * * *